(12) United States Patent
Wu et al.

(10) Patent No.: US 8,468,490 B2
(45) Date of Patent: Jun. 18, 2013

(54) ELECTRONIC DEVICE AND METHOD FOR CHECKING LAYOUT OF PRINTED CIRCUIT BOARD

(75) Inventors: Dan-Chen Wu, New Taipei (TW);
Shou-Kuo Hsu, New Taipei (TW);
Cheng-Hsien Lee, New Taipei (TW);
Chun-Jen Chen, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 0 days.

(21) Appl. No.: 13/315,291

(22) Filed: Dec. 9, 2011

(65) Prior Publication Data
US 2012/0278784 A1 Nov. 1, 2012

(30) Foreign Application Priority Data
Apr. 28, 2011 (TW) ................ 00114991 A

(51) Int. Cl.
*G06F 17/50* (2006.01)

(52) U.S. Cl.
USPC .............. 716/139; 716/126; 716/136

(58) Field of Classification Search
USPC ........................ 716/126, 136, 139
See application file for complete search history.

(56) References Cited

U.S. PATENT DOCUMENTS
2009/0016141 A1* 1/2009 Kuang et al. ............. 365/227

* cited by examiner

*Primary Examiner* — Thuan Do
(74) *Attorney, Agent, or Firm* — Altis Law Group, Inc.

(57) ABSTRACT

In a method for checking layout of a printed circuit board (PCB) using an electronic device, a power line is selected from a layout diagram of the PCB. The method searches for one or more signal lines which are overlapping with the selected power line from the layout diagram of the PCB. The method further locates attribute data of the searched signal lines and the selected power line in the layout diagram of the PCB, and displays the attribute data of the searched signal lines and the selected power line on a display device of the electronic device.

15 Claims, 10 Drawing Sheets

ELECTRONIC DEVICE AND METHOD FOR CHECKING LAYOUT OF PRINTED CIRCUIT BOARD

BACKGROUND

1. Technical Field

Embodiments of the present disclosure relate to printed circuit board design technology, and particularly to an electronic device and method for checking a layout of a printed circuit board using the electronic device.

2. Description of Related Art

Printed circuit board (PCB) layout is an important step in the manufacturing process of a motherboard and is closely related to product quality. If a power line of a part (e.g., a voltage regulator) in a PCB is overlapping with a signal line in the PCB, then interference noise is generated. The interference noise can interface with a differential signal transmitted by the power line. Recently, the signal lines which are overlapping with the power lines are checked manually, it is a time-consuming work and results in mistakes. Therefore, a more efficient method for checking a layout of a printed circuit board is desired.

DETAILED DESCRIPTION

All of the processes described below may be embodied in, and fully automated via, functional code modules executed by one or more general purpose electronic devices or processors. The code modules may be stored in any type of non-transitory computer-readable medium or other storage device. Some or all of the methods may alternatively be embodied in specialized hardware. Depending on the embodiment, the non-transitory computer-readable medium may be a hard disk drive, a compact disc, a digital video disc, a tape drive or other suitable storage medium.

Figure 1:
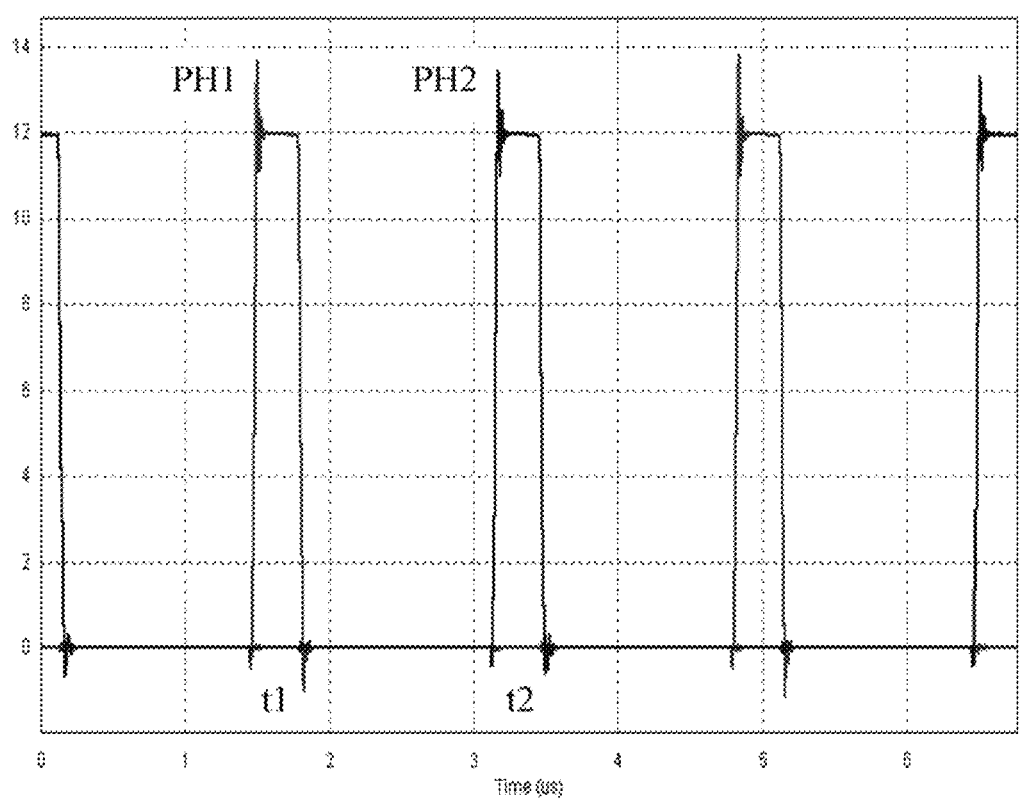
FIG. 1 is a schematic diagram of one embodiment of a voltage signal generated by a plurality of signal lines of a voltage regulator.
Figure 2:
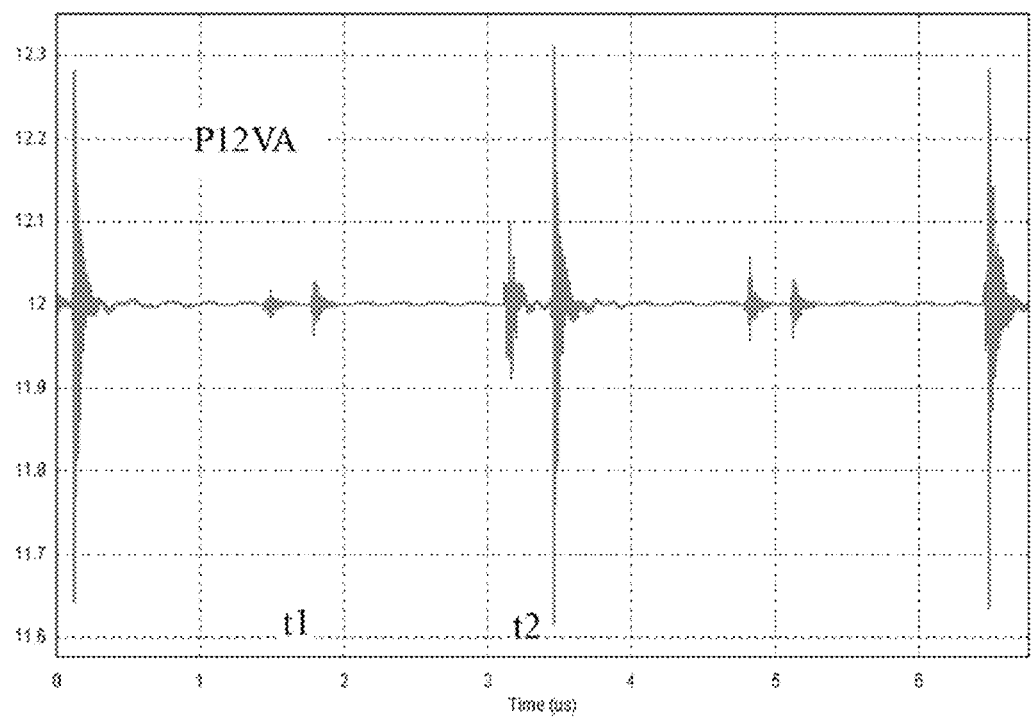
FIG. 2 is a schematic diagram of one embodiment of a voltage signal generated by a first power line.
Figure 3:
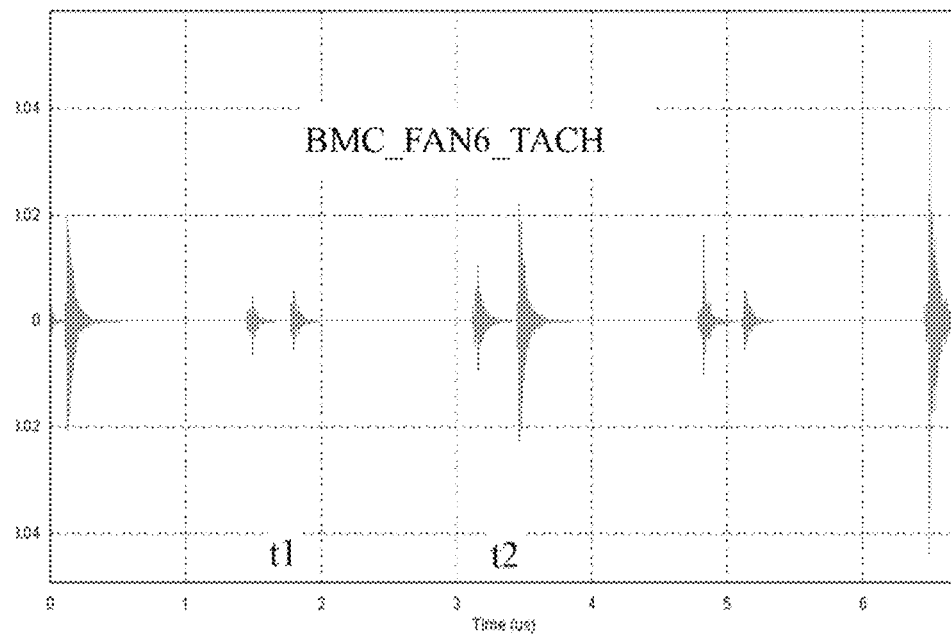
FIG. 3 is a schematic diagram of one embodiment of a voltage signal generated by a second power line.

Before introducing the present disclosure, a description of interference noise between power lines of a printed circuit board (PCB) and signal lines of the PCB will be introduced (see FIG. 1-FIG. 3).

FIG. 1 is a schematic diagram of one embodiment of a voltage signal generated by a plurality of signal lines of a voltage regulator. As shown in FIG. 1, "PH1" represents a first phase of the voltage signal generated by a first signal line at a first time "t1", and "PH2" represents a second phase of the voltage signal generated by a second signal line at a second time "t2". As shown in FIG. 2, "P12VA" represents a voltage signal generated by a first power line of a printed circuit board (PCB). As shown in FIG. 3, "BMC_FAN6_TACH" represents a voltage signal generated by a second power line of the PCB, such as a voltage signal for controlling a rotating speed of an electronic fan installed on the PCB.

Suppose that the first power line corresponding to "P12VA" is overlapping with the first signal line corresponding to "PH1," but not overlapping with the second signal line corresponding to "PH2". As shown in FIG. 2, interference noise occurs at the first time "t1" corresponding to first phase "PH1," but there is no interference noise at the second time "t2" corresponding to the second phase "PH2".

Suppose that the second power line corresponding to "BMC_FAN6_TACH" is overlapping with the first signal line corresponding to "PH1," but not overlapping with the second signal line corresponding to "PH2". As shown in FIG. 3, interference noise occurs at the first time "t1" corresponding to first phase "PH1," but there is no interference noise at the second time "t2" corresponding to the second phase "PH2".

Figure 4:
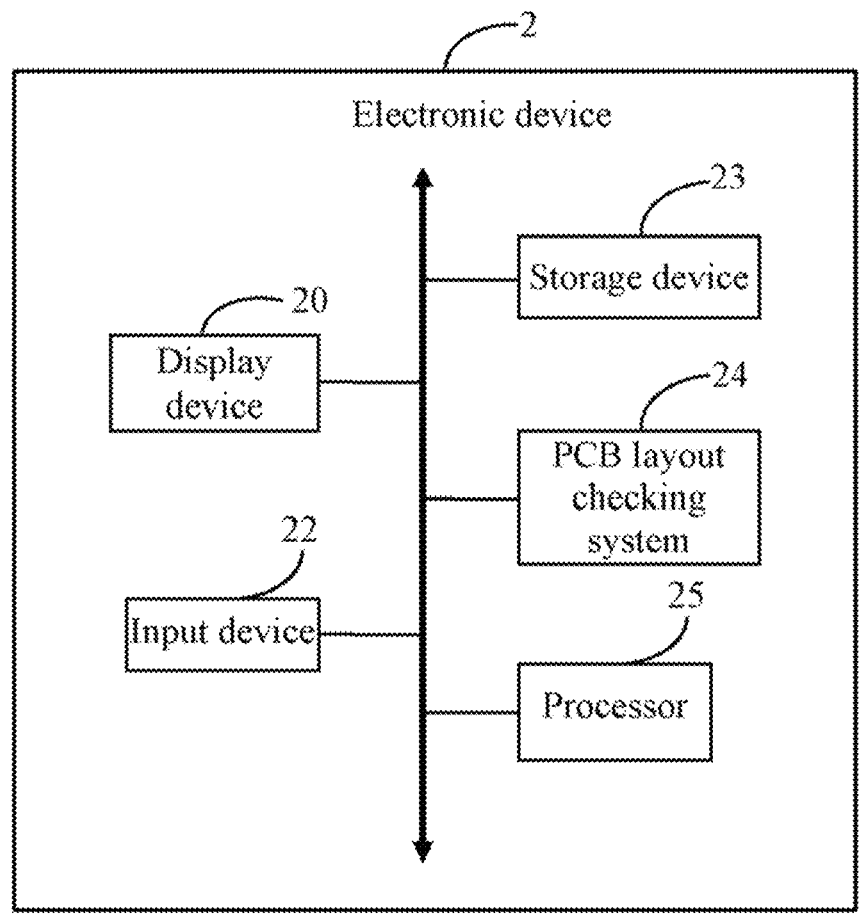
FIG. 4 is a block diagram of one embodiment of an electronic device including a PCB layout checking system.

FIG. 4 is a block diagram of one embodiment of an electronic device 2 including a PCB layout checking system 24. In the embodiment, the electronic device 2 further includes a display device 20, an input device 22, a storage device 23, and at least one processor 25. The electronic device 2 may be a computer, a server, or any other computing device. It should be understood that FIG. 4 illustrates only one example of the electronic device 2 that may include more or fewer components than illustrated, or a different configuration of the various components in other embodiments.

The display device 20 is used to display the layout diagram of the PCB, and the input device 22 may be a mouse, a keyboard, a touch screen, and/or a touchpad used to input computer readable data.

The PCB layout checking system 24 is used to search for one or more signal lines which are overlapping with a selected power line in a layout diagram of the PCB, and locate a position of each of the searched signal lines in the layout diagram. In one embodiment, the PCB layout checking system 24 may include computerized instructions in the form of one or more programs that are executed by the at least one processor 25 and stored in the storage device 23 (or memory). A detailed description of the PCB layout checking system 24 will be given in the following paragraphs.

Figure 5:
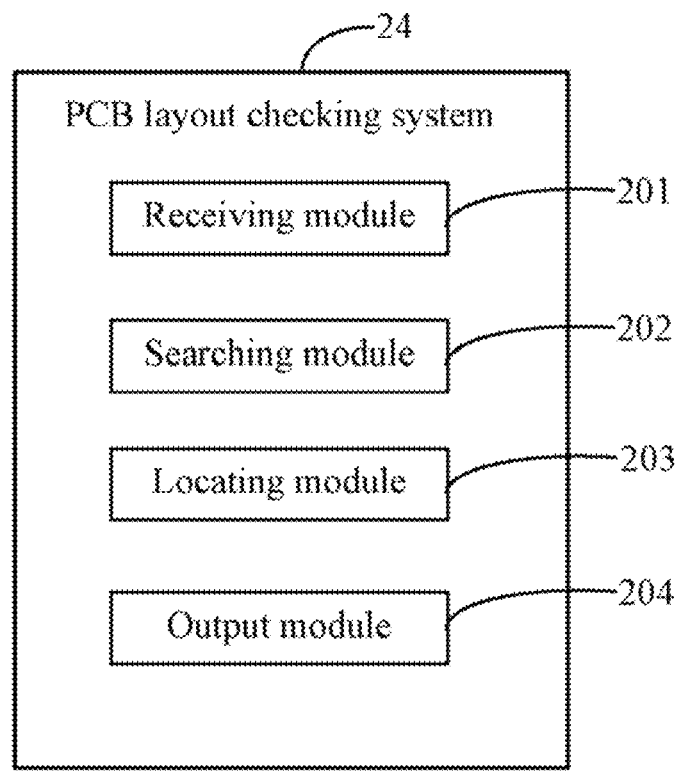
FIG. 5 is a block diagram of function modules of the PCB layout checking system included in the electronic device of FIG. 1.

FIG. 5 is a block diagram of function modules of the PCB layout checking system 24 included in the electronic device 2. In one embodiment, the PCB layout checking system 24 may include one or more modules, for example, a receiving module 201, a searching module 202, a locating module 203, and an output module 204. In general, the word "module", as used herein, refers to logic embodied in hardware or firmware, or to a collection of software instructions, written in a programming language, such as, Java, C, or assembly. One or more software instructions in the modules may be embedded in firmware, such as in an EPROM. The modules described herein may be implemented as either software and/or hardware modules and may be stored in any type of non-transitory computer-readable medium or other storage device. Some non-limiting examples of non-transitory computer-readable medium include CDs, DVDs, BLU-RAY, flash memory, and hard disk drives.

Figure 6:
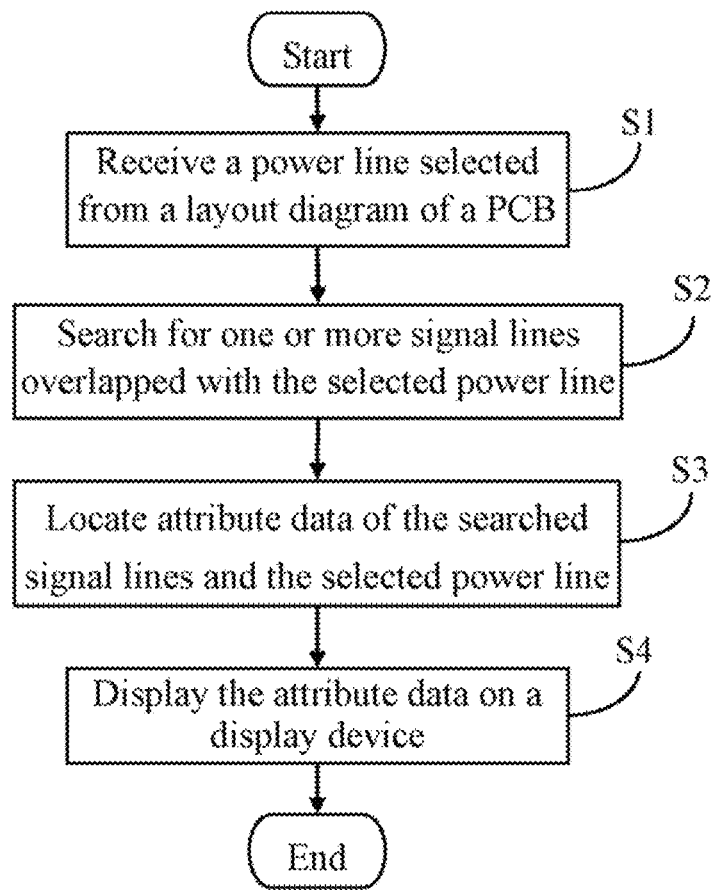
FIG. 6 is a flowchart of one embodiment of a method for checking a layout of a printed circuit board using the electronic device of the FIG. 1.

FIG. 6 is a flowchart of a first embodiment of a method for checking PCB layout using the electronic device 2. Depending on the embodiment, additional blocks may be added, others removed, and the ordering of the blocks may be changed.

In block S1, the receiving module 201 receives a power line selected from a layout diagram of the PCB. In one embodiment, the layout diagram is stored in the storage device 23 of the electronic device 2. It is should be understood that a plurality of power lines may be selected at the same time in other embodiments.

In block S2, the searching module 202 searches for one or more signal lines which are overlapping with the selected power line from the layout diagram of the PCB. A detailed description is as follows.

Figure 7:
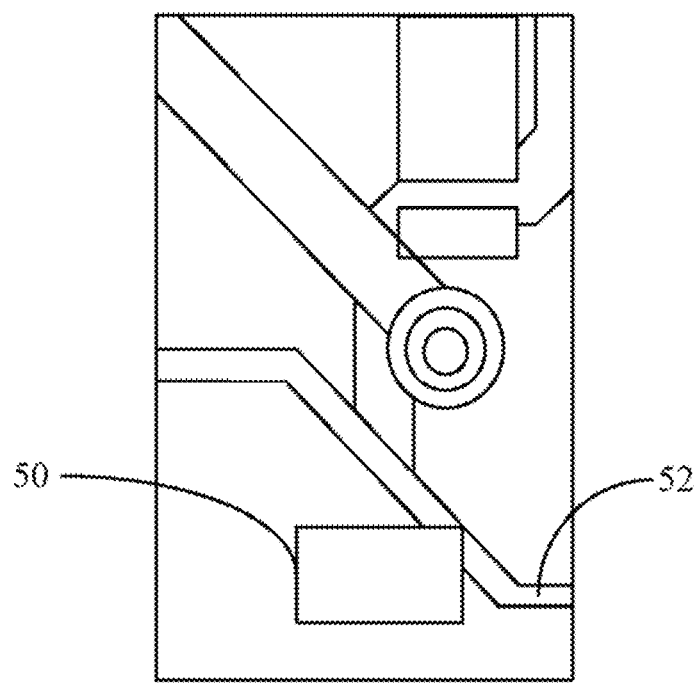
FIG. 7 is a schematic diagram of a power line which is overlapping with a plurality of signals lines.
Figure 8:
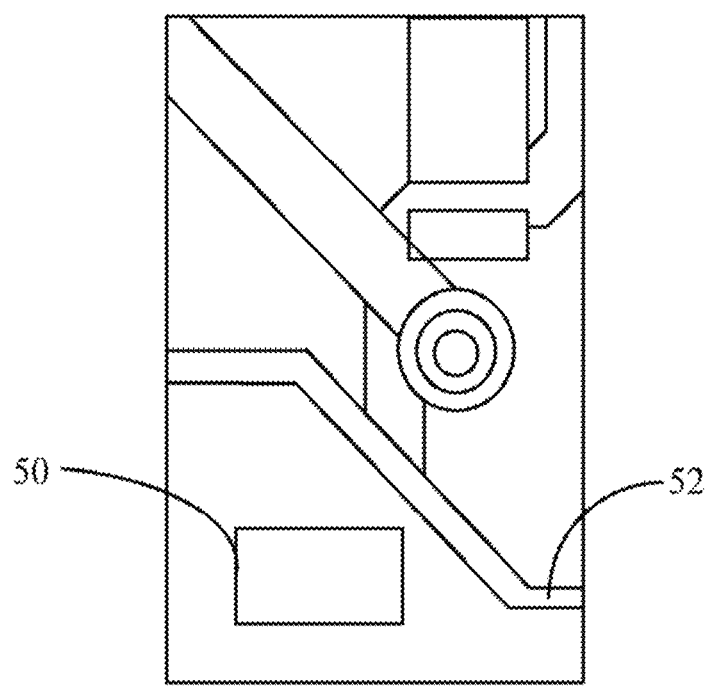
FIG. 8 is a schematic diagram of a power line which is not overlapping with any signals line.

In one embodiment, the searching module 202 calculates a smallest rectangle enclosing the selected power line, and searches for one or more intersection points between the smallest rectangle and each of the power lines in the layout diagram. If at least one intersection point between the smallest rectangle and a signal line is found (e.g., as shown in FIG. 7), the searching module 202 determines that the signal line is overlapping with the selected power line. Otherwise, if no intersection point between the smallest rectangle and a signal line is found (e.g., as shown in FIG. 8), the searching module 202 determines that the signal line is not overlapping with the selected power line. As shown in FIG. 7, a power line 50 is overlapping with a signal line 52. As shown in FIG. 8, the power line 50 is not overlapping with the signal line 52.

In other embodiment, the searching module 202 may create a polygon according to the selected power line, and search for one or more intersection points between the polygon and each of the power lines in the layout diagram, to determine if the selected power line is overlapping with other power lines.

Figure 9:
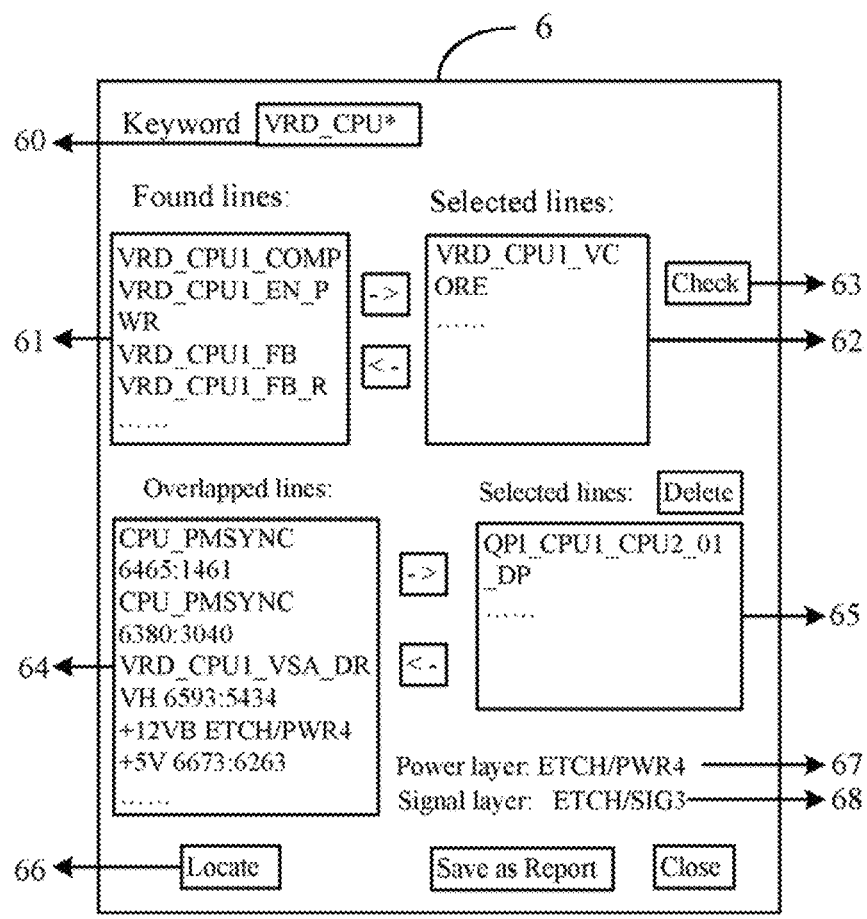
FIG. 9 and FIG. 10 are schematic diagrams of graphical interfaces provided by the PCB layout checking system.

As shown in FIG. 9, a user may input a keyword 60 in a user interface 6 for searching power lines in the layout diagram of the PCB. Then, the receiving module 201 obtains a set of power lines 61 from the layout diagram according to the keyword 60. The user may select one or more power lines in the set of the power lines 61 to check, to obtain selected power lines 62. If a check button 63 is selected by the user, the searching module 202 searches one or more signal lines which are overlapping with each of the selected power lines 62, to obtain searched signal lines 64.

Figure 10:
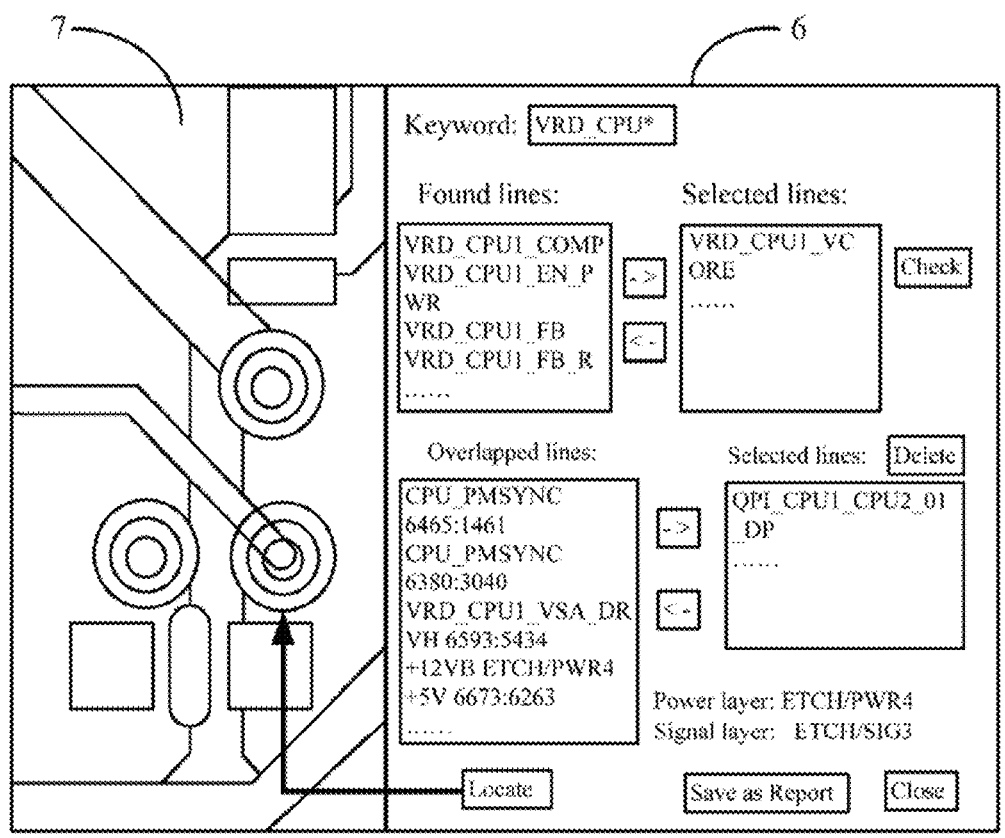

In block S3, the locating module 203 locates attribute data of the searched signal lines (i.e., the signal lines found in block S2) and the selected power line in the layout diagram of the PCB using a graphical interface (as shown in FIG. 10). In one embodiment, the attribute data of the searched signal lines may include a position of each of the searched signal lines, coordinates of each of the searched signal lines, and a layer of each of the searched signal lines in the PCB. The attribute data of the selected power line may include a position of the selected power line, coordinates of the selected power line, and a layer of the selected power line in the PCB. For example, as shown in FIG. 9, the layer of the selected power line may be a power layer 67, the layer of searched signal line may be a signal layer 68. If a position of a searched signal line needs to be located, the user may move the searched signal line to the right box 65, and select the searched signal line to check by clicking a locating button 66. Then, the locating module 203 locates the position of the searched signal line in the layout diagram of the PCB using the graphical interface, such as shown in FIG. 10.

In block S4, the output module 204 displays the attribute data of the searched signal lines and the selected power line on the display device 20 of the electronic device 2. Further, the output module 204 may output the attribute data of the searched signal lines and the selected power line into a layout checking report of the PCB, and store the layout checking report in the storage device 23 of the electronic device 2.

It should be emphasized that the above-described embodiments of the present disclosure, particularly, any embodiments, are merely possible examples of implementations, merely set forth for a clear understanding of the principles of the disclosure. Many variations and modifications may be made to the above-described embodiment(s) of the disclosure without departing substantially from the spirit and principles of the disclosure. All such modifications and variations are intended to be included herein within the scope of this disclosure and the present disclosure and protected by the following claims.

What is claimed is:

1. A computer-implemented method for checking layout of a printed circuit board (PCB) using an electronic device, the method comprising:
  receiving a power line selected from a layout diagram of the PCB, wherein the layout diagram is stored in a storage device of the electronic device;
  searching for one or more signal lines which are overlapping the selected power line from the layout diagram by calculating intersection points between the selected power line and the signal lines in the layout diagram;
  locating attribute data of the searched signal lines and the selected power line in the layout diagram of the PCB using a graphical interface; and
  displaying the attribute data of the searched signal lines and the selected power line on a display device of the electronic device.

2. The method according to claim 1, wherein the signal lines which are overlapping the selected power line are determined by:
  calculating a smallest rectangle enclosed by the selected power line;
  searching for one or more intersection points between the smallest rectangle and each of the signal lines in the layout diagram; and
  determining that a signal line is overlapping the selected power line upon the condition that at least one intersection point between the smallest rectangle and the signal line is searched; or
  determining that a signal line is not overlapping the selected power line upon the condition that no intersection point between the smallest rectangle and the signal line is searched.

3. The method according to claim 1, wherein the attribute data of the searched signal lines comprise a position of each of the searched signal lines, coordinates of each of the searched signal lines, and a layer of each of the searched signal lines in the PCB.

4. The method according to claim 1, wherein the attribute data of the selected power line comprise a position of the selected power line, coordinates of the selected power line, and a layer of the selected power line in the PCB.

5. The method according to claim 1, wherein the method further comprises: outputting the attribute data of the searched signal lines and the selected power line into a layout checking report, storing the layout checking report in the storage device of the electronic device.

6. An electronic device, comprising:
  a storage device;
  at least one processor; and
  one or more modules that are stored in the storage device and executed by the at least one processor, the one or more modules comprising instructions:

to receive a power line selected from a layout diagram of a printed circuit board (PCB), wherein the layout diagram is stored in the storage device;

to search for one or more signal lines which are overlapping the selected power line from the layout diagram by calculating intersection points between the selected power line and the signal lines in the layout diagram;

to locate attribute data of the searched signal lines and the selected power line in the layout diagram of the PCB using a graphical interface; and to display the attribute data of the searched signal lines and the selected power line on a display device of the electronic device.

7. The electronic device according to claim 6, wherein the signal lines which are overlapping the selected power line are determined by:

calculating a smallest rectangle enclosed by the selected power line;

searching for one or more intersection points between the smallest rectangle and each of the signal lines in the layout diagram; and determining that a signal line is overlapping the selected power line upon the condition that at least one intersection point between the smallest rectangle and the signal line is searched; or determining that a signal line is not overlapping the selected power line upon the condition that no intersection point between the smallest rectangle and the signal line is searched.

8. The electronic device according to claim 6, wherein the attribute data of the searched signal lines comprise a position of each of the searched signal lines, coordinates of each of the searched signal lines, and a layer of each of the searched signal lines in the PCB.

9. The electronic device according to claim 6, wherein the attribute data of the selected power line comprise a position of the selected power line, coordinates of the selected power line, and a layer of the selected power line in the PCB.

10. The electronic device according to claim 6, wherein the one or more modules further comprise instructions: to output the attribute data of the searched signal lines and the selected power line into a layout checking report, and storing the layout checking report in the storage device of the electronic device.

11. A non-transitory storage medium having stored thereon instructions that, when executed by a processor of an electronic device, causes the electronic device to perform a method for checking layout of a printed circuit board (PCB), the method comprising:

receiving a power line selected from a layout diagram of the PCB, wherein the layout diagram is stored in a storage device of the electronic device;

searching for one or more signal lines which are overlapping the selected power line from the layout diagram by calculating intersection points between the selected power line and the signal lines in the layout diagram;

locating attribute data of the searched signal lines and the selected power line in the layout diagram of the PCB using a graphical interface; and displaying the attribute data of the searched signal lines and the selected power line on a display device of the electronic device.

12. The non-transitory storage medium according to claim 11, wherein the signal lines which are overlapping the selected power line are determined by:

calculating a smallest rectangle enclosed by the selected power line;

searching for one or more intersection points between the smallest rectangle and each of the signal lines in the layout diagram; and determining that a signal line is overlapping the selected power line upon the condition that at least one intersection point between the smallest rectangle and the signal line is searched; or determining that a signal line is not overlapping the selected power line upon the condition that no intersection point between the smallest rectangle and the signal line is searched.

13. The non-transitory storage medium according to claim 11, wherein the attribute data of the searched signal lines comprise a position of each of the searched signal lines, coordinates of each of the searched signal lines, and a layer of each of the searched signal lines in the PCB.

14. The non-transitory storage medium according to claim 11, wherein the attribute data of the selected power line comprise a position of the selected power line, coordinates of the selected power line, and a layer of the selected power line in the PCB.

15. The non-transitory storage medium according to claim 11, wherein the method further comprises: outputting the attribute data of the searched signal lines and the selected power line into a layout checking report, and storing the layout checking report in the storage device of the electronic device.

* * * * *